(12) United States Patent
Hardy et al.

(10) Patent No.: US 7,612,564 B1
(45) Date of Patent: Nov. 3, 2009

(54) TILED RECEIVER COIL ARRAY WITH IMPROVED SPATIAL COVERAGE

(75) Inventors: Christopher Judson Hardy, Niskayuna, NY (US); Kenneth W. Rohling, Porter Corners, NY (US); Randy Otto John Giaquinto, Burnt Hills, NY (US)

(73) Assignee: General Electric Company, Niskayuna, NY (US)

( * ) Notice: Subject to any disclaimer, the term of this patent is extended or adjusted under 35 U.S.C. 154(b) by 14 days.

(21) Appl. No.: 12/112,065

(22) Filed: Apr. 30, 2008

(51) Int. Cl.
*G01V 3/00* (2006.01)
(52) U.S. Cl. ..................... 324/322; 324/318
(58) Field of Classification Search ......... 324/300–322; 600/407–445
See application file for complete search history.

(56) References Cited

U.S. PATENT DOCUMENTS

| | | | | |
|---|---|---|---|---|
| 5,221,900 A | * | 6/1993 | Larson, III | 324/307 |
| 7,474,098 B2 | * | 1/2009 | King | 324/318 |
| 7,511,497 B2 | * | 3/2009 | Wosik et al. | 324/318 |
| 2009/0128152 A1 | * | 5/2009 | Dannels et al. | 324/321 |

* cited by examiner

*Primary Examiner*—Brij B Shrivastav
(74) *Attorney, Agent, or Firm*—Jason K. Klindtworth

(57) ABSTRACT

A phased array for a magnetic resonance (MR) imaging apparatus is disclosed that includes a plurality of receiver coils arranged to form a staggered hexagonal coil array, with the staggered hexagonal coil array being rectangular in shape. Included in the plurality of receiver coils are a plurality of standard coils and a plurality of filler coils differing in shape from the standard coils. The shape of the filler coils is such that no more than negligible mutual inductance between the filler coils and all adjacent overlapping standard coils is present.

21 Claims, 5 Drawing Sheets

TILED RECEIVER COIL ARRAY WITH IMPROVED SPATIAL COVERAGE

BACKGROUND OF THE INVENTION

The present invention relates generally to medical imaging systems and, more particularly, to a radio frequency (RF) receiver coil array for a magnetic resonance (MR) imaging system.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of nuclear magnetic resonance (NMR) signals are received by a RF coil array and subsequently digitized and processed to reconstruct the image using one of many well known reconstruction techniques. With respect to the RF coil array, MR systems often include a dedicated receiver coil array that is integrated into a patient table or formed as a separate surface coil, with the receiver coil array comprising a two-dimensional array formed from a plurality of coils.

To minimize inter-element coupling between the individual receiver coils, RF receiver coil arrays are typically overlapped in such a way that each coil element exhibits negligible mutual inductance with nearest neighboring coil elements. In one known arrangement, shown in FIG. 1, an array 102 of coil elements 104 is arranged in a rectangular lattice. In such an arrangement, coupling each coil element 104 and those coil elements positioned to the left and right, and those coil elements positioned above and below, is minimized. However, in the arrangement of FIG. 1, each coil element 102 has substantial coupling with neighboring coil elements diagonal thereto, thus providing a non-optimal arrangement.

To overcome this drawback, overlapped arrays, such as the array 106 of FIG. 2, typically have alternate columns 108 (or rows) of coil elements 110 staggered by one half the element width. The overlap between coil elements 110 is such that a hexagonal lattice is created, where each coil element 110 is optimally overlapped to produce zero or negligible coupling with six neighboring coil elements. One drawback of this arrangement is that the staggering between alternate columns/rows can result in holes 112 in the coil array around the edges of the array. In each of these holes 112, signal-to-noise ratio (SNR) is reduced, resulting in degraded image quality in these areas in a reconstructed image.

It would therefore be desirable to have a coil array in which empty areas devoid of coil coverage are eliminated. It would also be desirable that such a coil array have minimal coupling between nearest-neighboring coil elements.

BRIEF DESCRIPTION OF THE INVENTION

The present invention provides a radio frequency (RF) receiver coil array for a magnetic resonance (MR) imaging system. The receiver coil array is comprised of a plurality of receiver coils arranged and shaped such that empty areas in the array devoid of coil coverage are eliminated. The plurality of receiver coils in the array are also arranged and shaped such that negligible coupling between nearest-neighboring coil elements is achieved.

In accordance with one aspect of the invention, a phased array for a magnetic resonance (MR) imaging apparatus includes a plurality of receiver coils arranged to form a staggered hexagonal coil array, the staggered hexagonal coil array being rectangular in shape. The plurality of receiver coils further includes a plurality of standard coils and a plurality of filler coils differing in shape from the standard coils, wherein the shape of the filler coils provides no more than negligible mutual inductance between the filler coils and all adjacent overlapping standard coils.

In accordance with another aspect of the invention, a magnetic resonance imaging MRI apparatus includes a plurality of gradient coils positioned about a bore of a magnet and an RF transceiver system and an RF switch controlled by a pulse module to transmit RF signals to an RF coil assembly to acquire MR images. The RF coil assembly includes a plurality of receiver coils arranged into a plurality of rows, with each of the plurality of rows having a first end and a second end, and wherein each row is shifted from adjacent rows such that the plurality of receiver coils are arranged to have a generally staggered hexagonal overlap pattern. The plurality of receiver coils includes a number of standard coils and a number of filler coils differing in shape from the standard coils, with the standard coils and the filler coils forming a perimeter of the RF coil assembly such that the first end of the plurality of rows linearly align along a first side of the RF coil assembly and such that the second end of the plurality of rows linearly align along a second side of the RF coil assembly.

In accordance with yet another aspect of the invention, a phased array for a magnetic resonance (MR) imaging apparatus includes a first row of receiver coils arranged along a first axis and a second row of receiver coils arranged along the first axis and offset from the first row of receiver coils along the first axis and along a second axis perpendicular to the first axis, the offset along the first and second axes being less than a width and a height of a receiver coil such that the first row of receiver coils overlaps the second row of receiver coils. The phased array also includes a third row of receiver coils arranged along the first axis and offset from the first and second rows of receiver coils along the second axis and aligned with the first row of receiver coils along the first axis, the third row of receiver coils overlapping the second row of receiver coils. Each of the first, second, and third rows of receiver coils includes an end coil that is stretched along the first axis such that ends of each of the first, second, and third rows of receiver coils are aligned along the second axis.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION OF THE PREFERRED EMBODIMENT

Figure 1:
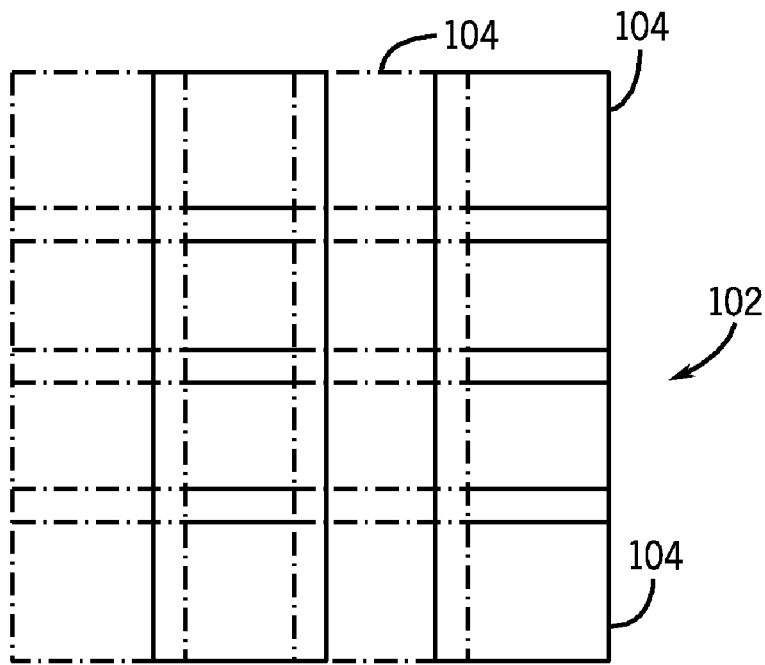
FIG. 1 is a top plan view of a prior art RF receiver coil array.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to, and communicates with, a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. In an embodiment of the invention, RF coil 56 is a multi-channel coil. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. It is recognized that RF coil 56 may take the form of a dedicated receive coil integrated into a patient table 65. Alternatively, it is also recognized that a separate RF coil (for example, a surface coil) may be enabled by transmit/receive switch 62 and may be used in addition to or in lieu of RF coil 56.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, or it may be further processed by the image processor 22 and conveyed to the operator console 12 and presented on the display 16.

Figure 3:
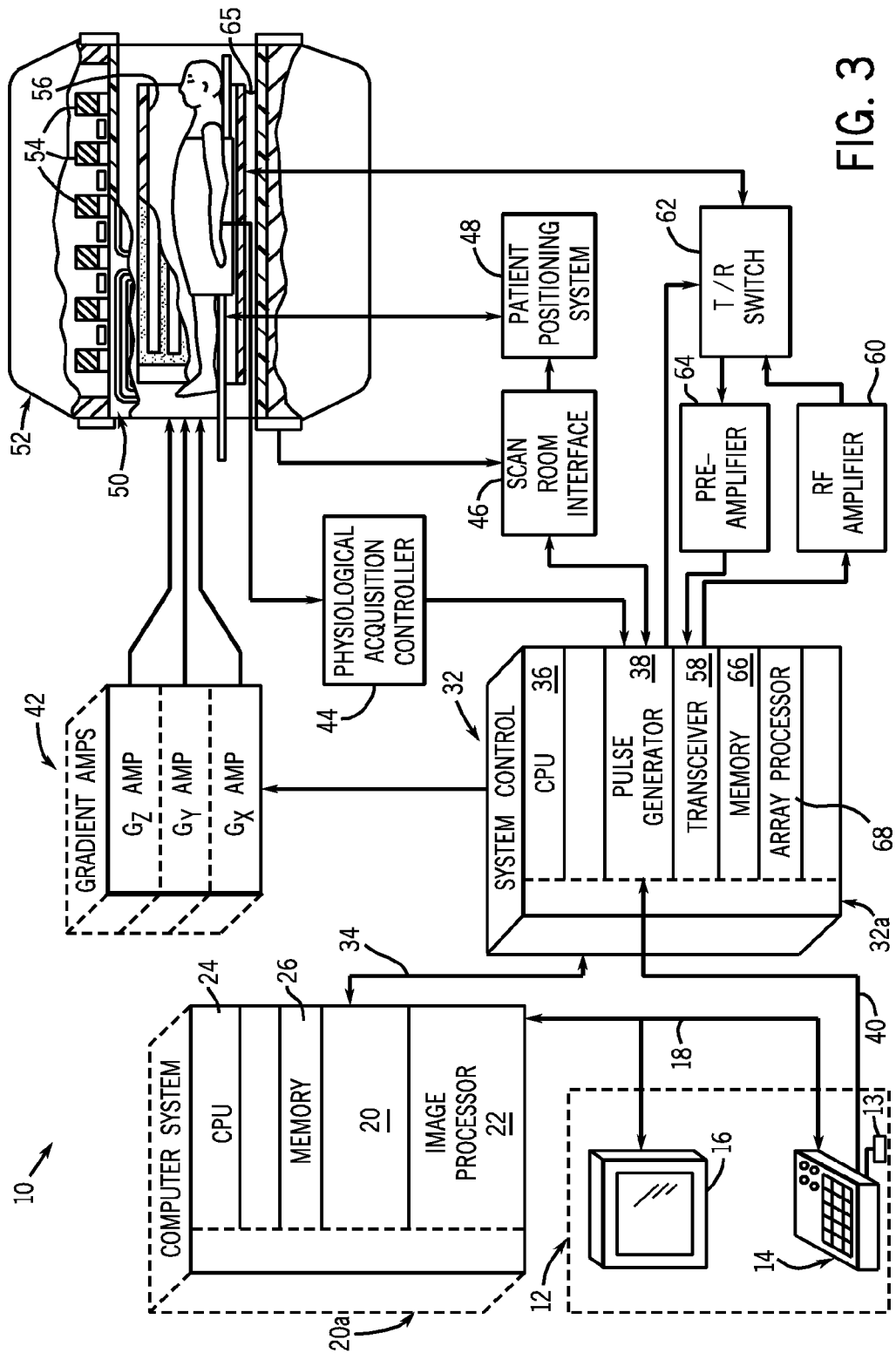
FIG. 3 is a schematic block diagram of an MR imaging system incorporating the present invention.
Figure 4:
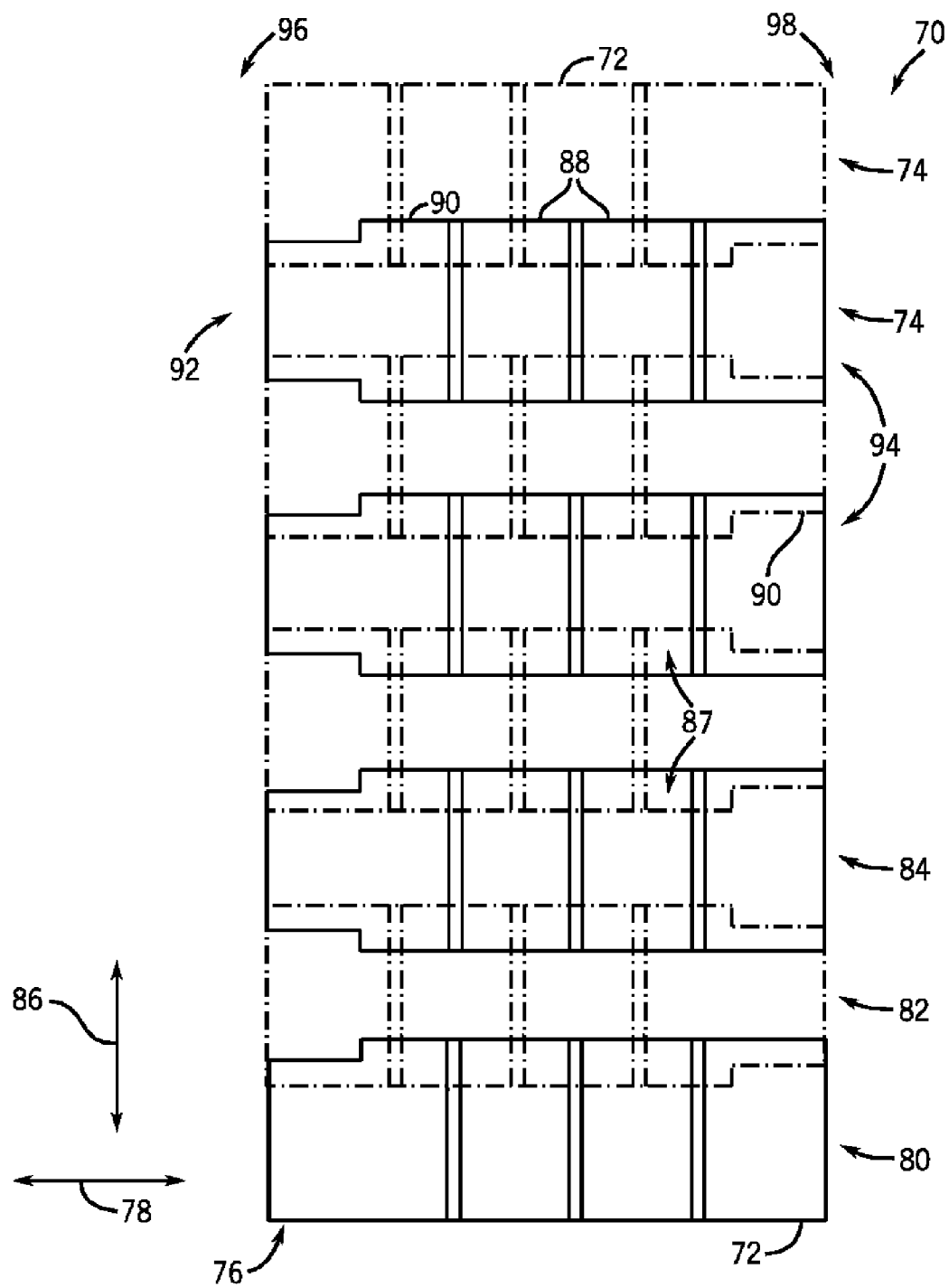
FIG. 4 is a top plan view of a RF receiver coil array according to an embodiment of the invention.

Referring to FIG. 4, a phased array of RF receiver coils 70 (i.e., RF coil assembly) that is included in the MRI system 10 of FIG. 3 is depicted, according to an embodiment of the invention. The phased array 70 is comprised of a plurality of receiver coils 72 that can form a surface coil array or an array integrated into a patient table 65 (FIG. 3). As shown in FIG. 4, the plurality of receiver coils 72 are arranged into a plurality of rows 74; however, it is also envisioned that the receiver coils 72 could also be arranged into a plurality of columns rather than rows. While phased array 70 is shown as including eight rows 74, with each of the rows including four receiver coils 72 (i.e., an 8×4 array), it is envisioned that phased array 70 could include a greater or lesser number of rows (or columns) and that each row could include a greater or lesser number of receiver coils therein.

As shown in FIG. 4, the plurality of receiver coils 72 is arranged such that they form a staggered hexagonal coil array. That is, receiver coils 72 are arranged to form a generally hexagonal overlap pattern, with receiver coils 72 in an interior portion of the phased array 70 overlapping with six adjacent or neighboring receiver coils 72. The plurality of receiver coils 72 are described as being arranged in a "generally" hexagonal overlap pattern, as it is recognized that coils positioned along a perimeter 76 of phased array 70 would not overlap six adjacent coils, but instead may only overlap three, four, or five adjacent receiver coils 72.

To form the hexagonal overlap pattern in phased array 70, each of the plurality of rows 74 of receiver coils 72 is shifted or staggered in comparison to adjacent rows of receiver coils. More specifically, the receiver coils 72 of each of the plurality of rows 74 are shifted or staggered in a first direction 78 (e.g., a horizontal direction) with respect to the receiver coils 72 of adjacent rows 74 of receiver coils. As shown in FIG. 4, the staggering of receiver coils 72 in first direction 78 between a first row 80 and an adjacent second row 82 is formed by an offset of, for example, about half the width of a receiver coil 72. As further shown in FIG. 4, a third row 84 is aligned with the first row 80 in the first direction 78, as is every other odd numbered row of receiver coils 72 in phased array 70. Additionally, each of the first row 80, second row 82, and third row 84 are shifted or staggered in a second direction 86 (e.g., a vertical direction) in comparison to adjacent rows of receiver coils 72. The shift in second direction 86 is such that an overlap 87 is achieved between adjacent rows 74. For example, second row 82 overlaps both first row 80 and third row 84. Thus, the combination of the shifting/staggering of the rows 74 of receiver coils 72 in first direction 78 and second direction 86 results in the staggered hexagonal overlap pattern between adjacent receiver coils 72 in phased array 70.

Figure 2:
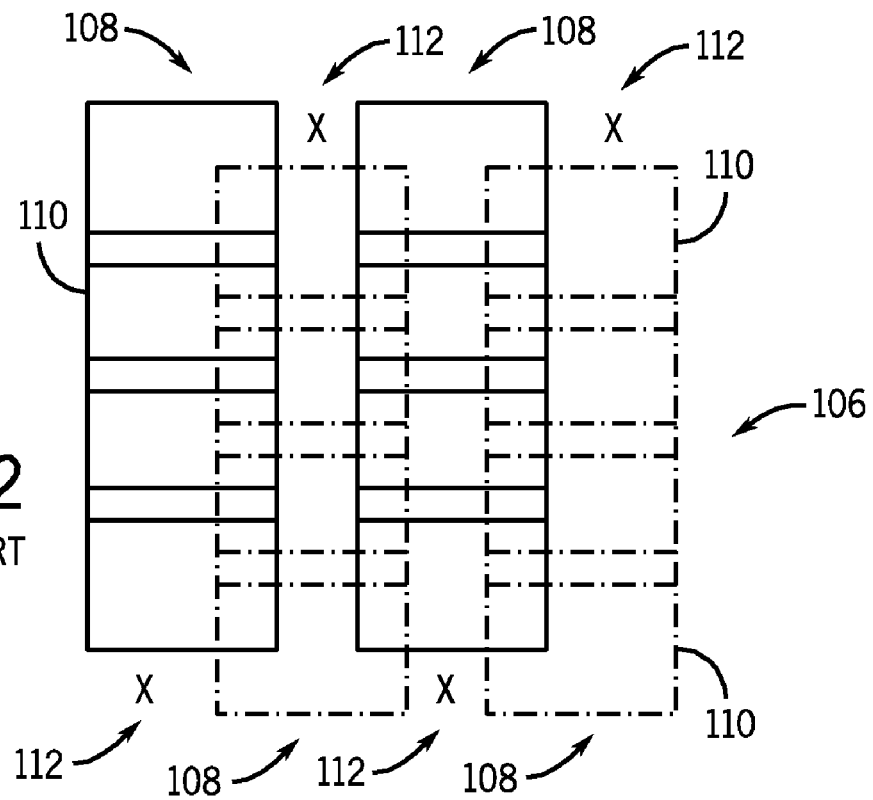
FIG. 2 is a top plan view of a prior art RF receiver coil array.

As shown in FIG. 4, each of the plurality of rows 74 of receiver coils 72 includes a plurality of standard coils 88 and a filler coil 90 positioned at one end of the row 74. In one embodiment, the standard coils 88 are identical in size and shape to one another and form rectangular coils, although it is also envisioned that widths of the standard coils could vary. The filler coil 90 differs in shape from the standard coils 88 and is non-rectangular in shape, as is shown in FIG. 4. As set forth in detail above, each of the rows 74 of receiver coils 72 is staggered with respect to adjacent rows of coils. Thus, it is recognized that were all receiver coils 72 in a row standard coils 88 having an identical shape, the resulting rows in phased array 70 would be staggered and holes would be present in the phased array, similar to the prior art phased array 106 shown in FIG. 2. Therefore, a filler coil 90 is included in each row that is stretched in the first direction 78 to eliminate the presence of such holes from the phased array. As shown in FIG. 4, a filler coil 90 is positioned on one end of each of the plurality of rows 74 in phased array 70. The position of filler coil 90 is alternated between opposing first and second ends 92, 94 of each row 74 when moving from row to row in phased array 70. That is, for a row 74 having filler coil 90 at a first end 92 thereof, the adjacent row(s) have the filler coil 90 at the second end(s) 94 thereof. The alternating of filler coil 90 between first and second ends 92, 94 in successive rows 74 results in a phased array 70 having a generally rectangular shape, as shown in FIG. 4, with the first end 92 of the plurality of rows 74 linearly aligning along a first side 96 of the phased array 70 and the second end 94 of the plurality of rows 74 linearly aligning along a second side 98 of the phased array 70.

Figure 5:
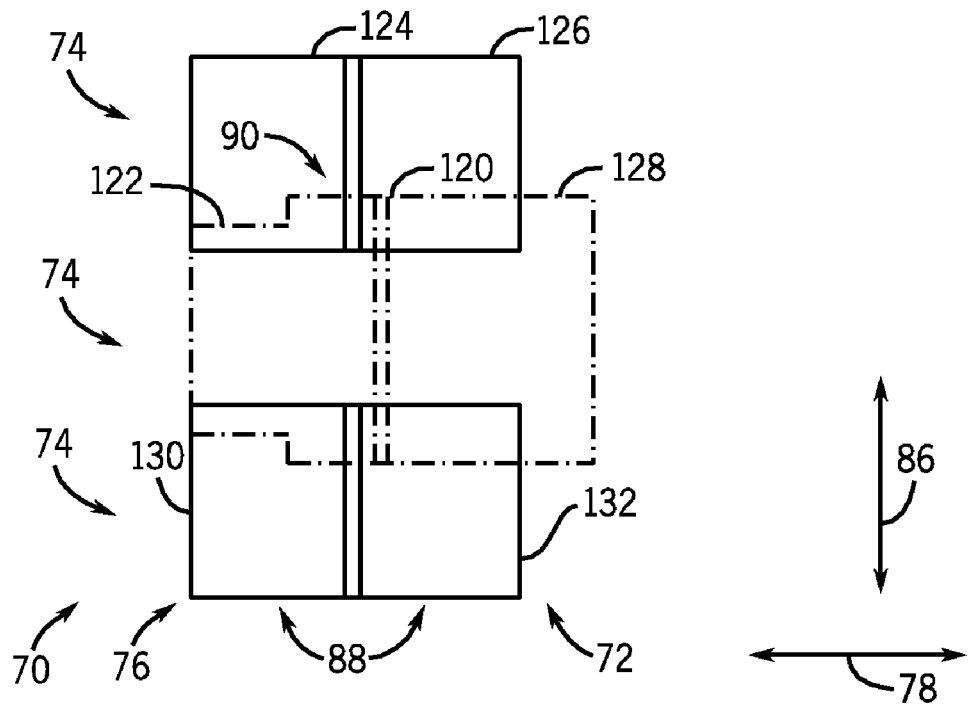
FIG. 5 is a top plan view of a portion of a RF receiver coil array according to an embodiment of the invention.

Referring now to FIG. 5, a portion of phased array 70 is shown. In an exemplary embodiment, filler coil 90 has a stepped configuration. A first portion 120 of filler coil 90 has a larger dimension in second direction 86 (i.e., height) than a second portion 122 of the filler coil. As shown in FIG. 5, the narrower second portion 122 of filler coil 90 is positioned towards the perimeter 76 of phased array 70 and includes that portion of filler coil 90 that was "stretched" in first direction 78. As is known in the art of phased array coils, it is desirable that coupling between adjacent/neighboring coils (i.e., intercoil coupling) be minimized, and as such, the coils are overlapped in such a way that nearest neighboring coils exhibit negligible mutual inductance (e.g., −0.1% to 0.1%) or, ideally, zero mutual inductance. Between standard coils 88, such zero/negligible mutual inductance is easily achieved by controlling the staggering of receiver coil rows 74 in first and second directions 78, 86. However, inclusion of filler coils 90 that are shaped differently from standard coils 88 can lead to inter-coil coupling. Thus, importantly, the filler coils 90 of the invention are configured such that they exhibit zero/negligible mutual inductance with adjacent overlapping standard coils 88. To achieve zero/negligible mutual inductance between filler coils 90 and adjacent standard coils 88, the dimensions of the filler coils are controlled.

Referring still to FIG. 5, in one example, the dimensions of filler coil 90 are controlled so as to provide zero/negligible mutual inductance with adjacent overlapping standard coils 88. To minimize coupling between filler coil 90 and a first standard coil 124, the height of second portion 122 of filler coil 90 is decreased in second direction 86 by approximately 20%. To minimize coupling between filler coil 90 and a second standard coil 126, the height of first portion 120 of filler coil is increased in second direction 86 by approximately 3%. To minimize coupling between filler coil 90 and a third standard coil 128, the first portion 120 of filler coil 90 is increased in the first direction 78 by approximately 1% of the coil width toward the interior of phased array 70. Because of symmetry between standard coils 88, the above adjustments to dimensions of filler coil 90 result in corresponding changes in coupling between filler coil 90 and fourth and fifth standard coils 130, 132.

It is recognized that each adjustment of a dimension of filler coil 90 perturbs the coupling between the filler coil and select neighboring standard coils 88. Thus, dimensions are chosen for filler coil 90 via an iterative process until the mutual inductance between the filler coil and all nearest neighboring standard coils 88 is zero/negligible. Therefore, in a final geometry for the above example, in which all nearest neighboring standard coils 88 show zero/negligible coupling with filler coil 90, the height (i.e., second direction 86) of the first portion 120 of the filler coil 90 is increased by 2.8%, the width (i.e., first direction 78) of second portion 122 is 0.45 times the filler coil width, the height of second portion 122 is reduced by 23%, and the first portion 120 of filler coil 90 is increased in the first direction 78 by 1% of the coil width. The above values are for purposes of example only, and it is to be understood that the values would be modified based on the dimensions and shape of the receiver coils 72 in a particular phased array 70. It is also recognized that not all filler coils 90 are identical in shape in phased array 70, as filler coils positioned at two of the corners of phased array 70 will have their dimensions adjusted as needed to achieve zero/negligible mutual inductance with its three nearest neighboring receiver coils, as is shown in FIG. 4.

Figure 6:
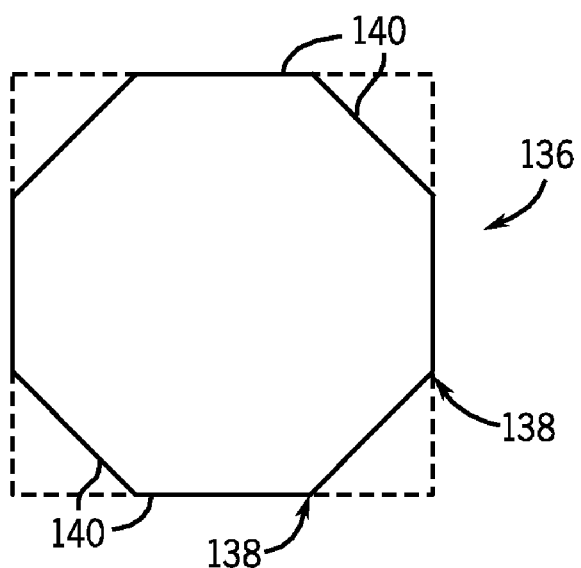
FIG. 6 is a top plan view of an octagonal shaped RF receiver coil according to an embodiment of the invention.

Referring now to FIG. 6, in another embodiment of the invention, a standard coil 136 forming part of the phased array 70 (FIG. 4) is generally octagonal in shape. That is, corners 138 of each standard coil 136 are angled or radiused such that eight distinct sides 140 are formed on the coil. Similar to the previous embodiment in which standard coils 88 were rectangular in shape (FIGS. 4 and 5), the standard coils 136 of FIG. 6 would be arranged in a generally hexagonal overlap pattern with adjacent coils. It is recognized that in the embodiment of FIG. 6, filler coils (not shown) included in the phased array may not be octagonal in shape, but may take other suitable shapes that provide zero mutual inductance between the filler coil and adjacent standard coils 136.

Figure 7:
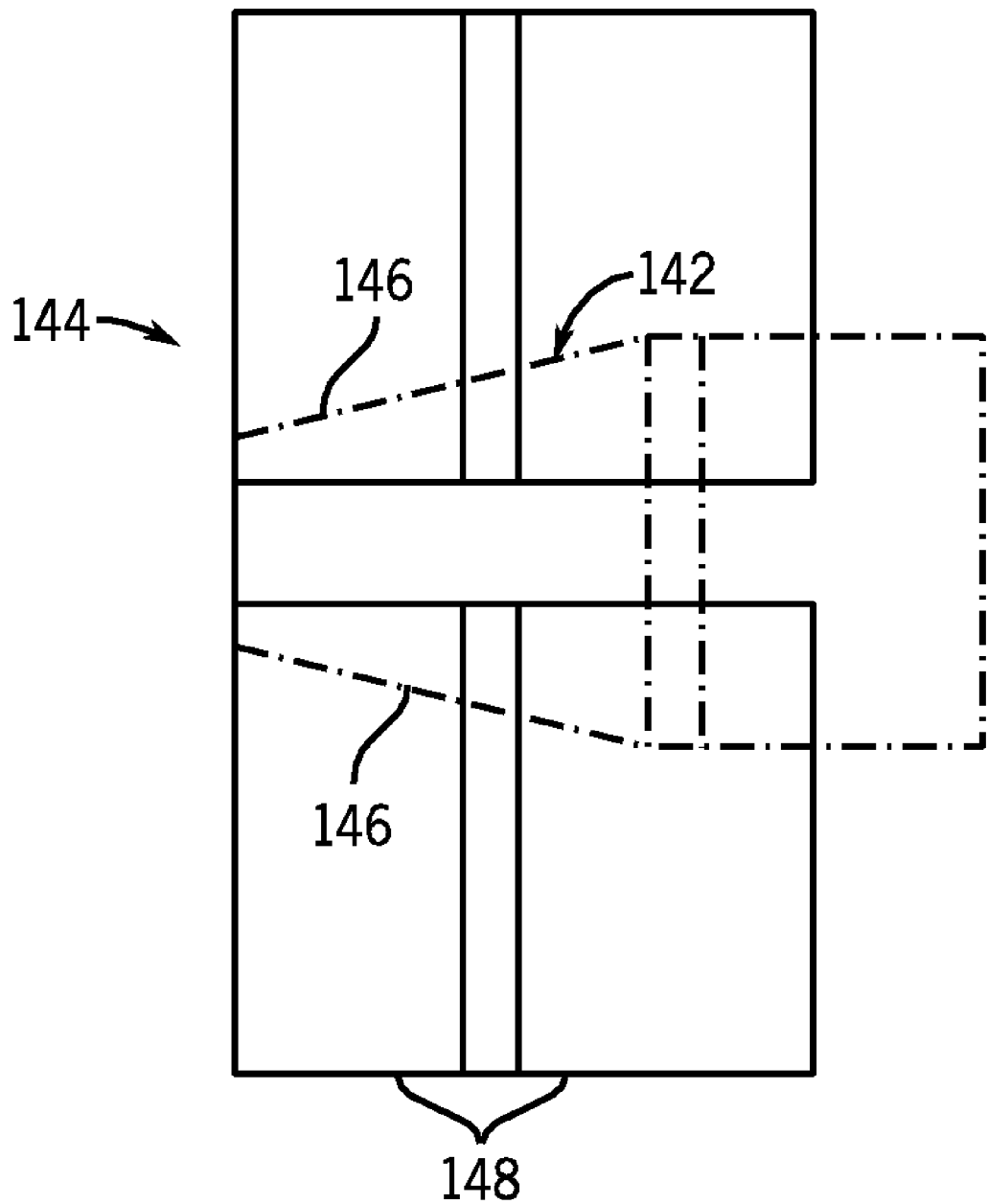
FIG. 7 is a top plan view of a portion of a RF receiver coil array according to an embodiment of the invention.

Referring now to FIG. 7, in another embodiment of the invention, rather than having a stepped configuration, a filler coil 142 forming part of a phased array 144 (FIG. 4) is formed with sloping top and bottom surfaces 146. Filler coil 142 thus has a height that is varied as a continuous function of horizontal position. Similar to that set forth about with respect to the filler coil 90 shown in FIG. 5, the dimensions of filler coil 142 are selected through an iterative process such that there is zero mutual inductance between filler coil 142 and adjacent overlapping standard coils 148.

Therefore, according to one embodiment of the invention, a phased array for a magnetic resonance (MR) imaging apparatus includes a plurality of receiver coils arranged to form a staggered hexagonal coil array, the staggered hexagonal coil array being rectangular in shape. The plurality of receiver coils further includes a plurality of standard coils and a plurality of filler coils differing in shape from the standard coils, wherein the shape of the filler coils provides no more than negligible mutual inductance between the filler coils and all adjacent overlapping standard coils.

According to another embodiment of the invention, a magnetic resonance imaging MRI apparatus includes a plurality of gradient coils positioned about a bore of a magnet and an RF transceiver system and an RF switch controlled by a pulse module to transmit RF signals to an RF coil assembly to acquire MR images. The RF coil assembly includes a plurality of receiver coils arranged into a plurality of rows, with each of the plurality of rows having a first end and a second end, and wherein each row is shifted from adjacent rows such that the plurality of receiver coils are arranged to have a generally staggered hexagonal overlap pattern. The plurality of receiver coils includes a number of standard coils and a number of filler coils differing in shape from the standard coils, with the standard coils and the filler coils forming a perimeter of the RF coil assembly such that the first end of the plurality of rows linearly align along a first side of the RF coil assembly and such that the second end of the plurality of rows linearly align along a second side of the RF coil assembly.

According to yet another embodiment of the invention, a phased array for a magnetic resonance (MR) imaging apparatus includes a first row of receiver coils arranged along a first axis and a second row of receiver coils arranged along the first axis and offset from the first row of receiver coils along the first axis and along a second axis perpendicular to the first axis, the offset along the first and second axes being less than a width and a height of a receiver coil such that the first row of receiver coils overlaps the second row of receiver coils. The phased array also includes a third row of receiver coils arranged along the first axis and offset from the first and second rows of receiver coils along the second axis and aligned with the first row of receiver coils along the first axis, the third row of receiver coils overlapping the second row of receiver coils. Each of the first, second, and third rows of receiver coils includes an end coil that is stretched along the first axis such that ends of each of the first, second, and third rows of receiver coils are aligned along the second axis.

The present invention has been described in terms of the preferred embodiment, and it is recognized that equivalents, alternatives, and modifications, aside from those expressly stated, are possible and within the scope of the appending claims.

What is claimed is:

1. A phased array for a magnetic resonance (MR) imaging apparatus comprising:
    a plurality of receiver coils arranged to form a staggered hexagonal coil array, the staggered hexagonal coil array being rectangular in shape;
    wherein the plurality of receiver coils comprises:
        a plurality of standard coils; and
        a plurality of filler coils differing in shape from the standard coils, wherein the shape of the filler coils provides no more than negligible mutual inductance between the filler coils and all adjacent overlapping standard coils.

2. The phased array of claim 1 wherein the plurality of receiver coils are arranged into a plurality of rows, each of the plurality of rows including a number of standard coils and a single filler coil.

3. The phased array of claim 2 wherein the filler coil is positioned at an end of the row of receiver coils, and wherein the filler coil is positioned at a first end of the row in a first row of receiver coils and the filler coil is positioned at a second end of the row in an adjacent row of receiver coils.

4. The phased array of claim 2 wherein the receiver coils in each of the plurality of rows are staggered with respect to the receiver coils in adjacent rows.

5. The phased array of claim 4 wherein the receiver coils in adjacent rows are staggered by half a width of a receiver coil.

6. The phased array of claim 1 wherein each of the plurality of filler coils has a stepped configuration.

7. The phased array of claim 1 wherein each of the plurality of filler coils has a height that is varied as a continuous function of horizontal position from one end of the filler coil to a second end of the filler coil.

8. The phased array of claim 1 wherein a width of the filler coil is greater than a width of the standard coil.

9. The phased array of claim 1 wherein the standard coils are rectangular in shape.

10. The phased array of claim 1 wherein corners on the standard coils are radiused or angled such that the standard coils are octagonal in shape.

11. A magnetic resonance imaging MRI apparatus comprising:
    a plurality of gradient coils positioned about a bore of a magnet; and
    an RF transceiver system and an RF switch controlled by a pulse module to transmit RF signals to an RF coil assembly to acquire MR images, the RF coil assembly comprising:
        a plurality of receiver coils arranged into a plurality of rows, each of the plurality of rows having a first end and a second end, and wherein each row is shifted from adjacent rows such that the plurality of receiver coils are arranged to have a generally staggered hexagonal overlap pattern; and
        wherein the plurality of receiver coils includes a number of standard coils and a number of filler coils differing in shape from the standard coils, the standard coils and the filler coils forming a perimeter of the RF coil assembly such that the first end of the plurality of rows linearly align along a first side of the RF coil assembly and such that the second end of the plurality of rows linearly align along a second side of the RF coil assembly.

12. The MRI apparatus of claim 11 wherein the filler coils are configured to have no more than negligible mutual inductance with all neighboring overlapping standard coils.

13. The MRI apparatus of claim 11 wherein the filler coil has a stepped configuration.

14. The MRI apparatus of claim 11 wherein the filler coils are positioned at one of the first and second ends in each of the plurality of rows.

15. The MRI apparatus of claim 14 wherein a position of the filler coil is alternated between the first and second ends of the rows in successive rows of receiver coils.

16. A phased array for a magnetic resonance (MR) imaging apparatus comprising:
    a first row of receiver coils arranged along a first axis;
    a second row of receiver coils arranged along the first axis and offset from the first row of receiver coils along the first axis and along a second axis perpendicular to the first axis, the offset along the first and second axes being less than a width and a height of a receiver coil such that the first row of receiver coils overlaps the second row of receiver coils; and a third row of receiver coils arranged along the first axis and offset from the first and second rows of receiver coils along the second axis and aligned with the first row of receiver coils along the first axis, the third row of receiver coils overlapping the second row of receiver coils;

wherein each of the first, second, and third rows of receiver coils includes an end coil that is stretched along the first axis such that ends of each of the first, second, and third rows of receiver coils are aligned along the second axis.

17. The phased array of claim 16 wherein the end coil in each of the first, second, and third rows of receiver coils is configured to have no more than negligible mutual inductance with all adjacently overlapping receiver coils.

18. The phased array of claim 16 wherein the end coil has a stepped configuration.

19. The phased array of claim 16 wherein the receiver coils are octagonal in shape.

20. The phased array of claim 16 wherein the offset along the first axis comprises half a width of one of the receiver coils.

21. The phased array of claim 16 further comprising at least one additional row of receiver coils, the at least one additional row of receiver coils being offset along the first and second axes from immediately adjacent rows of receiver coils.

* * * * *